Oct. 24, 1939. W. KAUTTER Re. 21,248

ANTIDISTORTION DEVICE

Original Filed Sept. 25. 1931

INVENTOR
WOLFGANG KAUTTER
BY H. G. Grover
ATTORNEY

Reissued Oct. 24, 1939

Re. 21,248

UNITED STATES PATENT OFFICE 21,248

ANTIDISTORTION DEVICE

Wolfgang Kautter, Berlin, Germany, assignor to Siemens & Halske, Aktiengesellschaft, Siemensstadt, near Berlin, Germany, a corporation of Germany Original No. 1,999,566, dated April 30, 1935, Serial No. 564,999, September 25, 1931. Application for reissue January 5, 1937, Serial No. 119,121. In Germany October 2, 1930

4 Claims. (Cl. 179—171)

In the transmission of the voice, music and the like by radio it happens that the high frequencies are unfavorably treated.

Accordingly it is an object of the present invention to overcome such difficulties and several ways and means by which these results are accomplished are shown by the accompanying drawing wherein—

Figure 1:
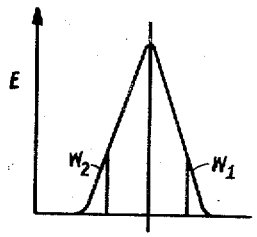
Fig. 1 shows the resonance curve of a receiving device.

Referring now to the drawing, the conditions which tend to produce unfavorable treatments of the higher frequencies will become more apparent by referring to the resonance curve of Fig. 1.

In this curve the abscissae indicate the frequency F and the ordinates indicate, for example, the potential E at the grid of the audion tube. The carrier wave appears in the middle of the resonance curve and therefore produces, relatively speaking, the highest potential at the grid. The side-band frequencies $w^1$ and $w^2$ result in lower potentials because of the droop of the resonance curve.

Figure 2:
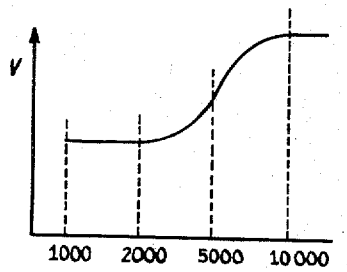
Fig. 2 shows a desired form of frequency curve for the receiver amplifier.

The fact that the side-bands are less favorably treated, and consequently also the higher frequencies, results in a distortion in reproduction. One, therefore, is compelled to so dimension the receiver apparatus, more particularly the audio frequency part thereof, that this preferential treatment of the high frequencies is avoided. Hence, the frequency curve of the amplifier should be chosen as shown, for instance, in Fig. 2, where the abscissae indicate the frequencies F and the ordinates the amplification factor or gain V of the arrangement. From this figure it can be clearly seen that at points between 4,000 and 10,000 cycles the amplification of the apparatus must be raised considerably.

Such an artificially produced distortion of the amplifier curve may be brought about in different ways. Starting from an amplifier insuring practically uniform amplification throughout the entire band, all that has to be done is to diminish the amplification for the lower pitches. This may be accomplished by suitable circuit means so that the desired curve-shape is obtained. However, this means in practice that the aggregate impression of volume is diminished inasmuch as part of the energy is destroyed as by artificially and intentionally reducing the gain. Another way would be to raise artificially the gain for the higher frequencies.

Figure 3:
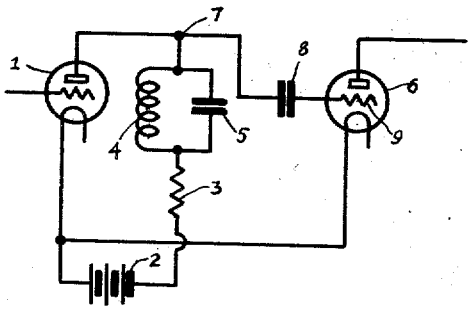
Fig. 3 illustrates one system which tends to produce a frequency curve of the character shown by Fig. 2.

An arrangement to produce this result is shown by Fig. 3, wherein the plate circuit of tube 1 comprises the battery 2, an ohmic resistance 3 and an oscillation circuit consisting of an inductance coil 4 and a condenser 5. Coupling with the tube 6 forming the next stage of the amplifier is provided from the point 7 by way of a condenser 8 to the grid electrode 9 of the tube 6.

The oscillation circuit comprising inductance 4 and capacity 5 is so dimensioned that the ascending branch of its resonance curve falls inside higher frequencies so that the gain of the amplifier becomes likewise greater for higher frequencies, with the result that the desired distortion of the curve-shape is secured.

There is, however, one demerit in this type of arrangement, which is that while greater gain is obtained for the higher frequencies, it is rather difficult to adapt the gain to any prevailing conditions with a reasonable degree of exactness. Another disadvantage resides in the circumstance that the inductance 4, which is usually iron-cored, is passed by the plate direct current. This, on the one hand, means that this choke-coil 4 must be made of comparatively large proportions inasmuch as the currents flowing through the plate circuit are liable to be of rather great strength; and furthermore the inductance value of the choke-coil and thus also the resonance point are greatly dependent upon the strength of the plate direct current, which may be different according to working conditions.

According to this invention the desired correction of the distortion of audio frequency in a tube arrangement is obtained by so proportioning and designing the coupling means that the transmission of the frequency band is insured in a plurality of the frequency-band groups.

Figure 4:
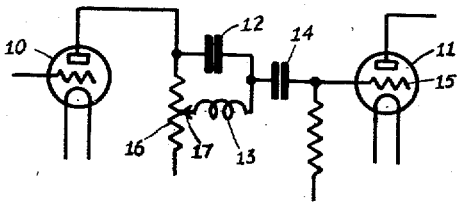
Fig. 4 illustrates a modification of the system of Fig. 3.

One embodiment according to this invention to produce this result is shown in the modification illustrated by Fig. 4. In this arrangement the coupling of the grid circuit of tube 11 with the plate circuit of tube 10 is effected by way of the capacitive channel comprising the condenser 12, and by way of the inductive channel, comprising the choke-coil 13. Condenser 12 and inductance 13 are connected in parallel and are brought to the grid condenser 14, which has one end terminal thereof connected with the grid 15 of the tube 11. The plate alternating current potential of tube 10 is taken off at the plate circuit resistance 16. The capacitive branch 12 is united with the end of resistance 16 near the plate. The inductive branch is united directly at 17 with the same resistance 16, which has, most preferably the form of a potentiometer resistance. In such a circuit arrangement the coupling of high frequencies is of maximum value, while that of the low frequencies is variable. By suitably setting the coupling of the inductive branch the relationship between the gain for the low frequencies and that of the high frequencies may be regulated with the result that a characteristic curve of the kind shown in Fig. 2 as being desirable is obtained.

Inasmuch as the low pitches are governing so far as the subjective sound volume impression is concerned, it will be seen that the aggregate volume decreases with increasing correction of distortion. Although all corrections of distortion no matter of what nature, are predicated upon the circumstance that the changes of amplification of an outfit can not be fully utilized particularly for the low pitches, which are most decisive so far as the volume is concerned, it will be seen that such decrease in the aggregate sound volume nevertheless makes an unfavorable impression. However, the latter is avoidable by the manner in which the low frequencies are coupled, i. e., that of the inductive branch is made constant, while only that of the capacitive branch is varied. This is shown in Fig. 5.

Figure 5:
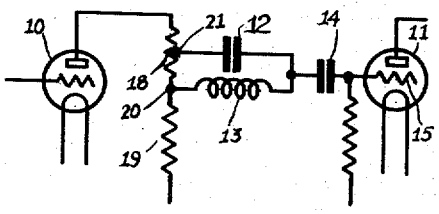
Fig. 5 illustrates a still further and preferred modification of Fig. 3.

Referring now to Fig. 5, the grid circuit of the tube 11 is in coupling relationship with the plate circuit of tube 10 by way of the capacitive branch 12 and the inductive branch 13. The plate resistances consist of two series-connected resistances 18 and 19. At the junction point 20 between the resistors 18 and 19 the inductive branch of the circuit is connected, whereas the capacitive branch 12 is variably united with the resistance 18. This latter variable connection preferably is in the nature of a potentiometer. Inasmuch as the coupling of the inductive branch, which is decisive for the subjective volume as it carries the lower pitches, is constant, it follows that the aggregate impression of the volume of the sound will not experience any changes if by shifting the contact 21 the amplification of the high frequencies being predominantly transmitted by way of branch 12 is varied.

The great advantage which the scheme according to the present invention offers resides in the fact that it is feasible to insure a correction of distortion of the audio frequencies quantitatively, this having not been feasible in the case of the circuit scheme shown in Fig. 3. Another advantage of a constructional nature is that no direct current flows through the choke-coil 13. As a result, this choke-coil 13 may be chosen of rather small proportions, and its inductance preserves an invariable value inasmuch as it experiences no biasing magnetization at all by the action of the direct current.

Having now described the invention, what is claimed and desired to secure by Letters Patent of the United States is the following:—

1. A system for correcting distortion at high audio frequencies comprising a plurality of audio amplifying devices, means for capacitively connecting the output of one amplifying device with the input of the other amplifying device, a resistance forming part of the direct current output circuit of the first amplifying device, and a parallel combination of inductance and capacity elements having one terminal of each connected to the resistance element and the other terminal to the capacity coupling connecting the amplifying devices, and at least one of said parallel elements having its said one terminal adjustable along said resistance element.

2. In a distortion correcting audio amplifier system, a plurality of audio amplifying devices, a resistance element connected in the output circuit of the first amplifying device, a capacity element connected to the resistance element so as to connect capacitively the output of one amplifying device with the input of the second amplifying device and thereby form a low impedance path for the transference of high audio frequency output signals from the first to the second amplifying device and a high impedance path for low audio frequency output signals, an inductance element shunting said capacity, said inductance element also including a slidable tap connected with the resistance element to connect the output of the first amplifying device to the input of the second amplifying device and thereby form a low impedance path to low audio frequency currents and a high impedance path to high audio frequency currents, and a second capacity element in series with each of said capacity and inductance elements for transferring output energy from the first amplifying device to the second of said amplifying devices.

3. In combination with a source of audio energy, a tube having its input electrodes coupled to said source, a second tube, a path consisting of pure reactance connecting the plate of the first tube to the input grid of the second tube, a reactance of opposite sign to that of said path, a resistance included in the plate circuit of said first tube, a slider on said resistance adapted to divide the latter variably into two portions, and a circuit between the grid and cathode of the second tube including said reactance of opposite sign and one of said resistance portions.

4. In an audio frequency coupling circuit having a pair of input terminals and a pair of output terminals, a capacity element connected in series between one of said input terminals and one of the output terminals, a resistance element connected between the terminals of one of said pairs of terminals, a slider on said resistance element, and a frequency discriminating element connected between said slider and the terminal of said second pair of terminals to which the said capacity element is connected.

WOLFGANG KAUTTER.